United States Patent [19]
Patrick et al.

[11] Patent Number: 5,457,387
[45] Date of Patent: Oct. 10, 1995

[54] MAGNETIC RESONANCE IMAGER WITH REMOVABLE ELEMENT RF COIL

[75] Inventors: John L. Patrick, Chagrin Falls; Xueming Zou, Chesterland; Nicholas J. Mastandrea, Bedford Hts.; Paul T. Orlando, Mentor, all of Ohio

[73] Assignee: Picker International, Inc., Highland Hts., Ohio

[21] Appl. No.: 87,929

[22] Filed: Jul. 6, 1993

[51] Int. Cl.$^6$ .................................................. G01R 33/20
[52] U.S. Cl. ........................................... 324/318; 324/322
[58] Field of Search ................................ 324/318, 322, 324/312, 314, 300; 335/299, 298; 128/653.2, 653.5

[56] References Cited

U.S. PATENT DOCUMENTS

| | | | |
|---|---|---|---|
| 4,591,818 | 5/1986 | Butson | 335/299 |
| 4,694,255 | 9/1987 | Hayes | 324/318 |
| 4,820,987 | 4/1989 | Mens | 324/318 |
| 4,837,515 | 6/1989 | Nishihara et al. | 324/322 |
| 4,845,431 | 7/1989 | Sullenberger | 324/318 |
| 4,882,560 | 11/1989 | Young et al. | 335/299 |
| 4,893,083 | 1/1990 | Overweg et al. | 324/320 |
| 4,905,316 | 2/1990 | Okamoto | 324/319 |
| 5,007,425 | 4/1991 | Vanek et al. | 128/653 A |
| 5,045,792 | 9/1991 | Mehdizadeh | 324/318 |
| 5,075,624 | 12/1991 | Bezjak | 324/322 |
| 5,138,260 | 8/1992 | Molyneaux et al. | 324/309 |
| 5,144,239 | 9/1992 | Oppelt | 324/318 |
| 5,274,332 | 12/1993 | Jaskolski et al. | 324/322 |
| 5,280,248 | 1/1994 | Zou et al. | 324/318 |

FOREIGN PATENT DOCUMENTS

| | | |
|---|---|---|
| 142760A2 | 11/1983 | European Pat. Off. . |
| 135326A3 | 3/1985 | European Pat. Off. . |
| 177855A2 | 4/1986 | European Pat. Off. . |
| 404354934 | 12/1992 | Japan . |

OTHER PUBLICATIONS

"A Design Technique For Producing Desired Field Pattern in Generalized RF Coils", Mehdizadeh, SMRM 8th Meeting, vol. 2, 1989, p. 936.
"Quadrature–Headcoil and Helmholtz–Type Neckcoil—An Optimized RF–Antenna–Pair for Imaging Head, Neck and C–Spine and 1.0 and 1.5 T", Krause, et al. SMRM 7th Meeting, vol. 2, 1988, p. 845.
"Produce Data—Extended Coverage Head Coil"—Vista®MR Option, Picker Advertising Brochure, 1989.

*Primary Examiner*—Sandra L. O'Shea
*Assistant Examiner*—Raymond Y. Mah
*Attorney, Agent, or Firm*—Fay, Sharpe, Beall, Fagan, Minnich & McKee

[57] ABSTRACT

A primary gradient coil assembly (22) is mounted in the inner bore or cylinder (20) of a vacuum dewar (18) that surrounds a superconducting magnet assembly (10). A pair of end ring assemblies, such as electrically conductive lapped segment loops (38) are supported by the gradient coil assembly (22). The end ring segments are capacitively coupled. A plurality of removable radio frequency coil element assemblies (40) are selectively attached to and detached from the gradient coil assembly. Each of the removable RF coil element assembly includes a dielectric housing (50), a longitudinally extending conductor element (52), an electrical connector (44), and circuit components (54) which connects the longitudinal conductor element with the electrical connector. The connector is electrically connected, at radio frequencies, with the ring assembly (38). A mechanical interlock (60) mechanically locks and selectively releases the removable element assemblies (40) to the gradient coil assembly. Sets of different removable element assemblies are provided with different effective radii, i.e. different physical displacements of the electrical conductor elements (52) from the gradient coil assembly, different resonance frequencies, i.e. different reactive elements (58), and the like to adapt the different removable element assemblies for different imaging applications. The removable element assemblies may be completely removed when specialty RF coils, such as a head coil, biplanar gradient coil, or surface coil are used.

17 Claims, 3 Drawing Sheets

MAGNETIC RESONANCE IMAGER WITH REMOVABLE ELEMENT RF COIL

BACKGROUND OF THE INVENTION

The present invention relates to the magnetic resonance arts. It finds particular application in conjunction with magnetic resonance imaging and will be described with particular reference thereto.

Heretofore, magnetic resonance imagers have commonly included a series of annular resistive or superconducting magnets. Vacuum dewars in superconducting magnets and housing structures of resistive magnets have defined a central, longitudinal bore within which the subject was received. Commonly, a series of gradient magnetic field coils were mounted to a cylindrical dielectric former which was mounted in the magnet bore, reducing the patient receiving diameter. A whole body RF coil was mounted on another dielectric former which was mounted in the interior bore of the gradient coil dielectric former, further reducing the patient receiving diameter.

The diameter reductions become more critical when self-shielded gradient coils are used. With self-shielded gradient coils, there are two sets of gradient coils disposed in a spaced relationship. The pair of gradient coil sets produce magnetic fields which (1) sum within the bore to create the desired magnetic field gradients and (2) subtract outside the bore. The subtraction zeroes the field to inhibit magnetic field gradient pulses from inducing eddy currents in the main magnet and associated structures. To achieve this shielding effect efficiently, significant minimum spacing between the primary and secondary gradient coils is required. Analogously, an RF shield is advantageously disposed between the RF coil and the gradient coils to prevent the RF pulses from inducing eddy currents in the gradient coils. Again, a significant, minimum spacing between the RF coils and the RF shield is required.

A large patient aperture is advantageous. A large patient receiving bore not only accommodates large patients and provides a less claustrophobic environment, but it also allows imaging of portions of the subject further from the center of the bore. For example, shoulder imaging requires the patient's shoulders to be displaced radially inward from the RF coil. On the other hand, a large patient aperture has associated costs such as a reduced sensitivity of the RF body coil, a lower gradient performance, and more costly magnets.

Mounting the RF body coil to a continuous dielectric cylindrical former reduces the patient receiving diameter to that of the former. In a birdcage-type RF coil, there are typically a plurality of longitudinally extending foil strips mounted to the dielectric former. Even although the foil strips are displaced by significant distances around the circumference, the dielectric former is solid and continuous between them. Not only does this continuous cylindrical dielectric former reduce the bore, it also obstructs the use of specialty coils such as insert head or biplanar gradients. These insert coils need to be secured to the inner diameter of the gradient tube for structural stability. The intervening RF coil cylinder obstructs direct access to the gradient coil dielectric former and the foil strips of the RF coil limit where interconnections can be made.

The present invention provides a new and improved RF coil assembly which overcomes the above-referenced problems and others.

SUMMARY OF THE INVENTION

In accordance with one aspect of the present invention, a magnetic resonance apparatus is provided which includes a generally toroidal magnet assembly and a radio frequency coil assembly. The generally toroidal magnet assembly generates a magnetic field through an examination region. The magnet assembly includes a cylindrical former which extends around the examination region. The radio frequency coil assembly includes a pair of end ring assemblies and a plurality of longitudinally extending coil element assemblies. The pair of end ring assemblies extend circumferentially around and are supported by the cylindrical former. Each of the longitudinally extending coil assemblies is removably attachable to and detachable from the cylindrical former in electrical communication with the end ring assemblies at radio frequencies.

In accordance with a more specific aspect of the present invention, each of the coil element assemblies includes a dielectric housing, an electrically conductive strip or element extending longitudinally therealong, and circuit components for connecting the electrically conductive element to an electrical connecting means for selectively connecting the elements with the ring assemblies.

In accordance with another more limited aspect of the present invention, each of the longitudinally extending coil element assemblies includes a mechanical locking means for mechanically locking and selectively releasing the coil element assembly to the dielectric former.

In accordance with another aspect of the present invention, a magnetic resonance imaging apparatus is provided. A toroidal superconducting magnet assembly generates a temporally constant magnetic field through an examination region. The superconducting magnet assembly includes a generally cylindrical member which defines a longitudinally extending bore around the examination region. A gradient coil assembly including a cylindrical dielectric former which supports a plurality of gradient coils is mounted in the bore. A radio frequency coil assembly includes a pair of end ring assemblies and a plurality of longitudinally extending coil elements. The end ring assemblies extend circumferentially around and are mechanically supported by the gradient coil assembly. The longitudinally extending coil elements are mechanically attachable to the gradient coil assembly in electrical communication with the end ring assemblies at radio frequencies and selectively detachable from the gradient coil assembly. A sequence control means controls the gradient coil means and the radio frequency coil assembly to generate gradient and radio frequency pulses of magnetic resonance imaging sequences.

In accordance with another aspect of the present invention, a method of magnetic resonance imaging is provided. A first plurality of the removable coil element assemblies which have a first effective diameter and which are tuned to a first resonance frequency are attached to the cylindrical former. The patient is inserted into the bore and a magnetic resonance imaging sequence is performed. After the patient is removed from the bore, the first coil element assemblies are removed and replaced by a second plurality of removable coil element assemblies which have a second effective diameter and which are tuned to a second resonance frequency. At least one of the first and second diameters and the first and second resonance frequencies are different from each other. Thereafter, another patient is inserted in the bore and another magnetic resonance imaging sequence is performed.

One advantage of the present invention is that it provides the patient with more free room inside the bore for limbs and helps relieve claustrophobic reactions.

Another advantage of the present invention is that it enables the diameter of the RF coil to be contracted for greater sensitivity with smaller patients or imaging regions.

Another advantage of the present invention is that it facilitates reconfiguring the coil for different applications, such as different RF frequencies, lumbar imaging, or the like.

Another advantage of the present invention is that it simplifies serviceability. Electronic components associated with the RF coil are readily removed and replaced without a service call by the operator.

Another advantage of the present invention is that it provides free access to the inner surface of the gradient coil tube for mounting specialty coils such as insert head gradient coils, biplanar gradient coils, and specialty RF transmit and receive coils.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
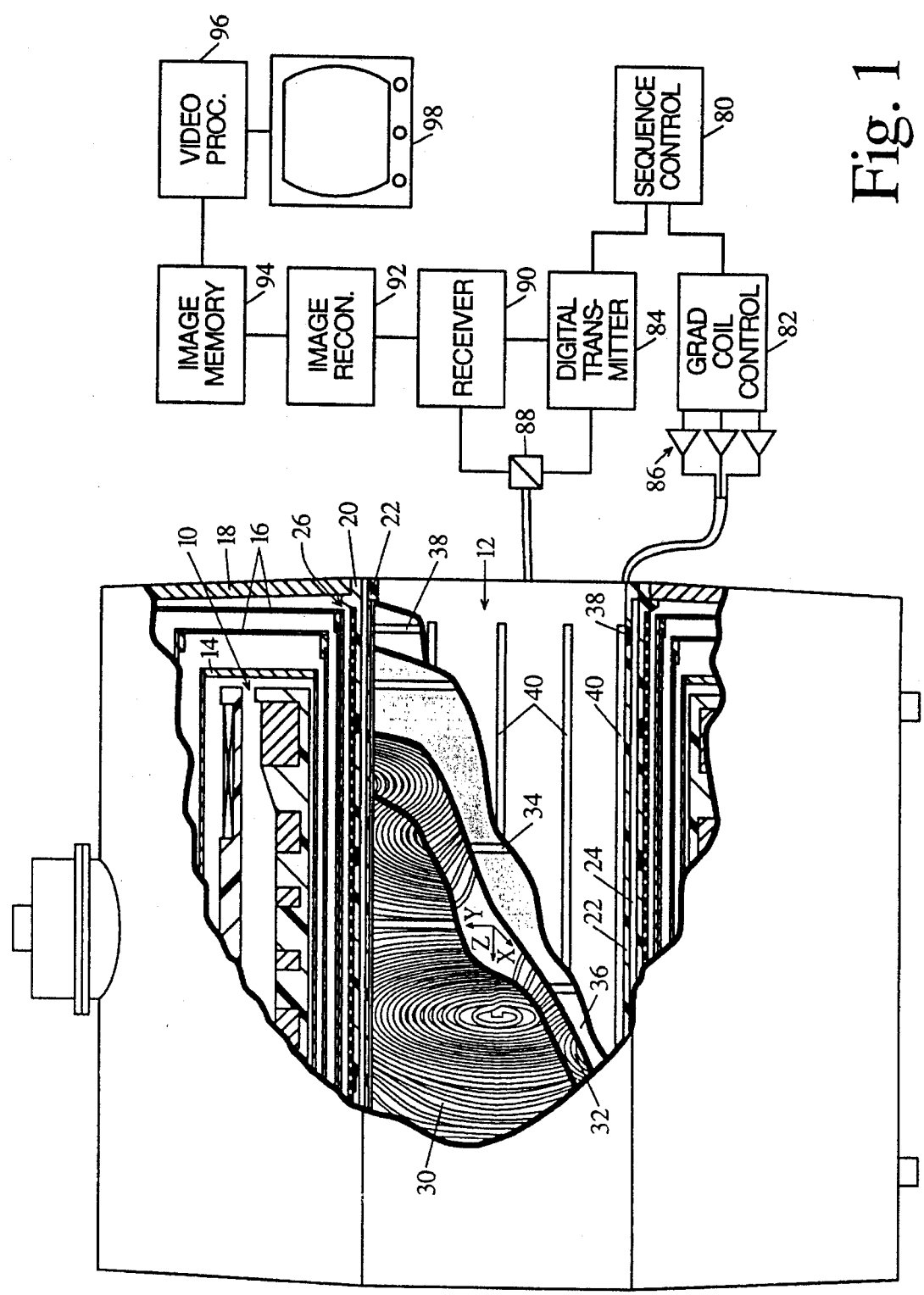
FIG. 1 is a diagrammatic illustration of a magnetic resonance imaging system in accordance with the present invention.
Figure 2:
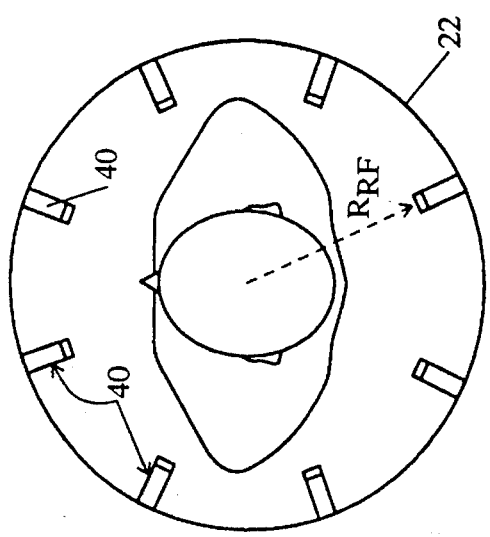
FIG. 2 is an end view of the imaging system of FIG. 1.

With reference to FIGS. 1 and 2, a self-shielded superconducting magnetic field coil assembly 10 includes a pair of interacting superconducting coils. The coils interact to generate a temporally constant substantially uniform magnetic field axially along a longitudinal or z-axis of a central bore 12. The magnetic fields also interact such that they substantially cancel in regions outside of the bore. The self-shielded main magnet field assembly 10 is supported in a liquid helium vessel or can 14 which maintains the superconducting magnet coils cold enough to be superconducting with the impressed magnetic fields. To reduce helium boil-off, a series of progressively warmer cold shields 16 surround the helium can 14. A toroidal vacuum vessel or dewar 18 encases the cold shields to define a vacuum reservoir.

The vacuum vessel or dewar 18 includes a cylindrical tubular member 20 which defines its inner bore. A cylindrical gradient coil assembly 22 is inserted into the vacuum vessel bore 20, leaving an annular gap 24 therebetween. The annular gap, preferably, holds trays or racks for holding thin, ferrous magnetic shield members for shimming the main magnetic field. The primary gradient coil assembly 22 is displaced from a secondary or shield gradient coil assembly 26. The primary and secondary or shield gradient coil assemblies 22, 26 work together to generate gradient magnetic fields which superimpose in the bore 12 to generate magnetic field gradients of a selected profile. The primary and secondary gradient magnetic field assemblies are configured such that their magnetic fields cancel in regions around the secondary gradient magnetic field assembly such that the gradient magnetic field pulses do not induce currents in the cold shield 16, the helium can 14, or other adjacent electrical conductors.

More specifically to the preferred embodiment, the primary gradient coil assembly 22 includes four fingerprint type gradient coils 30 for generating magnetic fields in an x or horizontal direction. Analogously, a second set of fingerprint gradient coils 32 are mounted 90° rotated relative to the x-gradient coils for generating gradient magnetic fields in a y or vertical direction. A series of annular z-gradient coils 34 extend circumferentially around the bore 12. A radio frequency shield 36, such as lapped sections of copper sheet or mesh, extends around an inner diameter of the gradient coils for shielding the gradient coils from radio frequency energy. Two or more radio frequency coil end rings 38 also extend around the primary gradient coil assembly 22. The end rings 38 are preferably composed of lapped segments that are capacitively coupled to support radio frequency signals but not low frequencies or direct current. The x-gradient coils 30, the y-gradient coils 32, the z-gradient coils 34, the RF screen 36, and the end rings 38 are electrically insulated from each other, preferably by being encased in a matrix of epoxy potting material. For convenience of manufacture, the gradient coils, the RF screen, and the end rings are preferably layered on a fiber reinforced plastic cylindrical former and the entire assembly encased in epoxy potting to form a strong, rigid assembly.

The RF coil assembly includes a birdcage-type coil. That is, it includes the pair of end rings. 38 and a plurality of longitudinally extending RF coil element assemblies 40. The conductor assemblies 40 are electrically connected with the end rings at radio frequencies and extend longitudinally along the bore 12. Although eight longitudinal elements are illustrated in FIG. 2, it is to be appreciated that the number may be more or less. More specifically to the preferred embodiment, each of the longitudinal element assemblies 40 is individually removable. This enables a smaller number of elements, such as four symmetric elements, only elements along the lumbar region of the patient, or other element combinations to be utilized.

Figure 3:
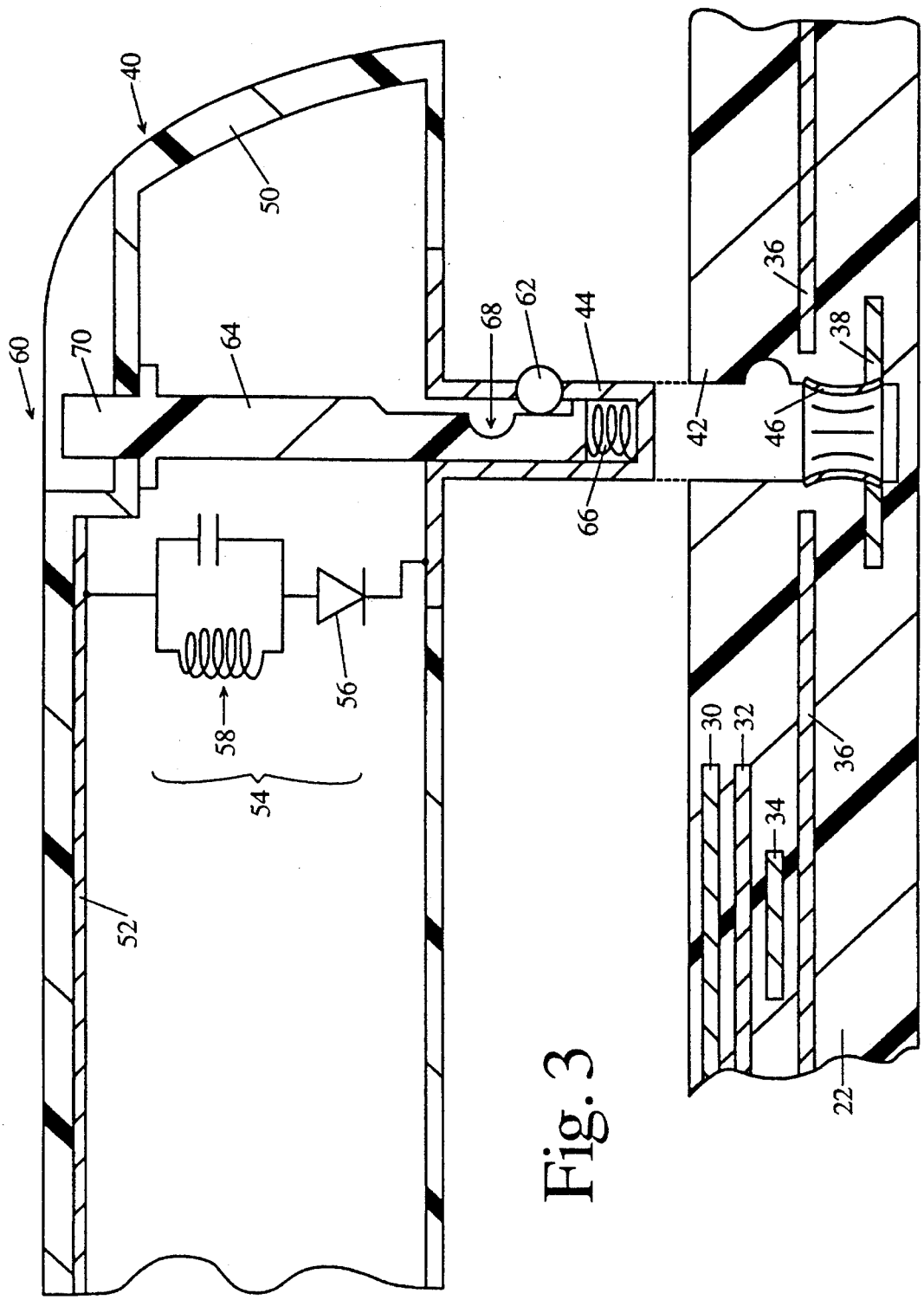
FIG. 3 is a detailed, sectional view illustrating an exemplary mechanical interconnection of the RF coil elements and the scanner bore; and, FIG. 4 is a cross-sectional view of the patient bore with an alternate embodiment of the present invention.

With particular reference to FIG. 3, the gradient coil assembly 22 defines a plurality of bores 42 for receiving connector pins 44 therein. In the illustrated embodiment, the connector pins provide for both mechanical and electrical connection. An electrical connection means 46 within each of the bores provides for electrical communication with the end ring 38 at radio frequencies. In the embodiment illustrated in FIG. 3, the connecting means 46 is a series of electrical spring contacts which provide frictional and direct electrical contact with the connector pins 46. However, because the radio frequency coil is operated at radio frequencies, electrical communication may be achieved by capacitive coupling rather than direct physical interconnection.

Each of the removable element assemblies 40 include a plastic housing 50 and a metal foil or other electrically conductive coil element 52 extending along an outermost part of the housing 50. The diameter of the electrically conductive elements 52 around a geometric center of the bore 12 defines the effective diameter of the radio frequency coil. Yet, between each conductor, the bore is effectively the diameter of the gradient coil assembly inner bore 12.

A removable assembly electrical connection means includes electrical components 54, including PIN diodes 56, filtering, matching or tuning circuits 58, and the like, connected between the longitudinal coil element 52 and the end rings 38. In the illustrated embodiment, connection pin 44 functions as part of the electrical connection means. The circuit components may be mounted in the removable assembly 40 or within the gradient coil assembly 22. Preferably, components which fail most often, such as PIN diodes 56 and other active components are connected between the electrical connector 44 and the longitudinal coil element 52. This enables ready replacement of a removable coil element assembly 40, if one of the components 54 should fail. The operator merely unplugs the connector pin 44 from the bore 42 and replaces the removable element assembly 40 with another one. No service call is required. The removed RF coil element assembly can be returned for repair or can be permanently replaced.

Preferably, circuits 58 are also included within the removable coil elements. The circuit 58 tunes the RF coil to a preselected radio frequency. By replacing the removable assemblies 40 with assemblies tuned to different frequencies, the magnetic resonance scanner can be readily reconfigured to image different dipoles. For example, by replacing the removable element assemblies 40, the operator can quickly convert the coil from the resonance frequency of hydrogen to the resonance frequency of phosphorous or other dipoles.

Although it is advantageous to have the removable element assemblies 40 readily removable by the operator, the removed element assemblies are also readily accessible to the patient. Because the removable element assemblies project, they are apt to be grabbed by the patient and used as handles when positioning oneself for greater comfort in the magnetic resonance scanner. In order to avoid inadvertent removal of the removable element assemblies 40 by the patient, a mechanical interlock means 60 is provided. A mechanical interlock means selectively locks the removable element assembly into the bore, rendering it unremovable until a mechanical mechanism is released. In the illustrated embodiment, a detent or ball member 62 projects from the connecting pin 44 and engages an overhanging ledge of the gradient coil assembly 22. A mechanical element 64 engages the ball member 62, holding it in the engaging or locking position. When the mechanical member 64 is depressed against a spring 66, the ball member 62 can be cammed into a recess or pocket 68 by a withdrawing force. The mechanical element 64 is connected with a user interface means, such as a pushbutton 70, mounted in a well in the plastic member 50 to prevent its inadvertent depression. Optionally, a further mechanical interlock may be provided which prevents the pushbutton from being depressed until a second user operation is performed. Various other interlocks are also contemplated including threaded rotational connections, twist connectors, bayonet connectors, pinned connectors, electrically released and actuated connectors, magnetically released and actuated connectors, pneumatically locked connectors, and the like. Connectors which hold the removable coil element assemblies 40 securely against inadvertent removal while providing for easy release when removal is desired are preferred. In the illustrated embodiment, pin 44 performs longitudinal alignment and positioning functions, part of the mechanical interlock functions, and part of the electrical connection function. Of course, separate elements can be provided for each of these functions.

Figure 4:
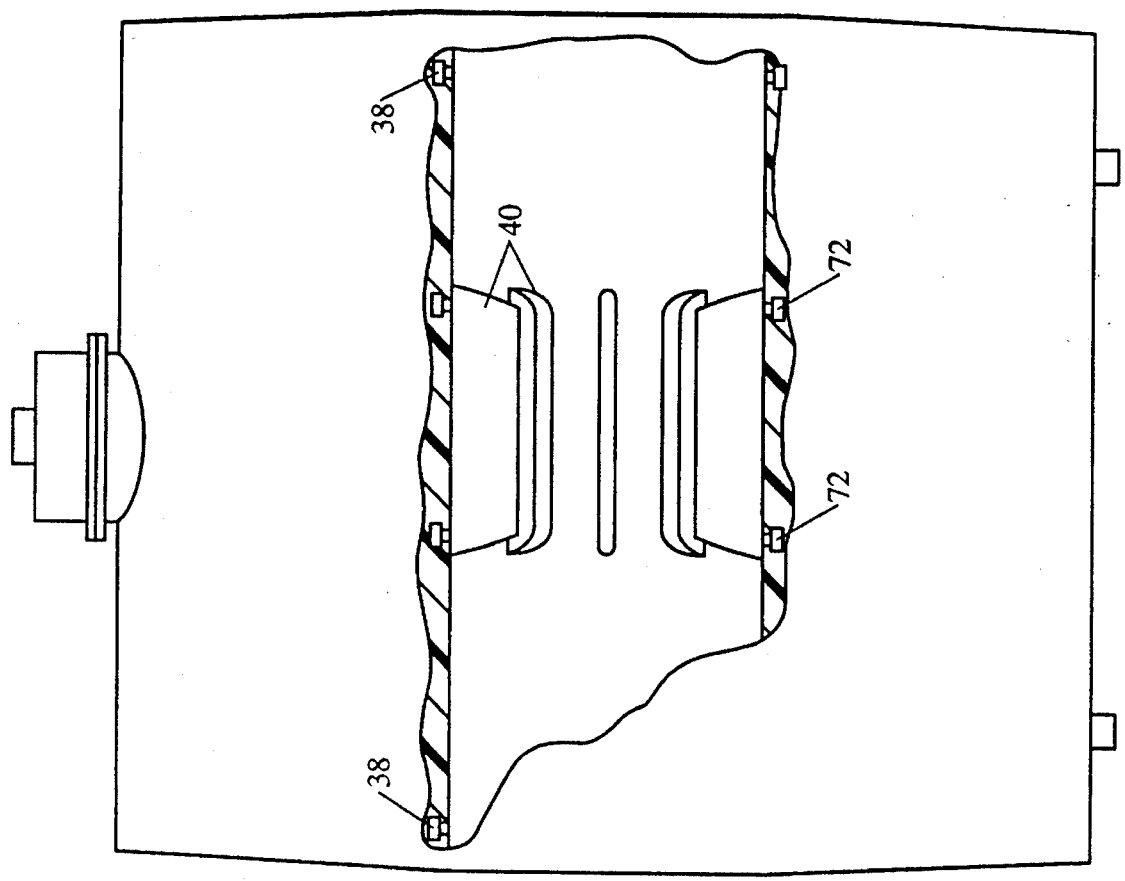

With reference to FIG. 4, a second set of taller removable element assemblies 40 may be provided. In this manner, the effective RF coil radius $R_{RF}$ can be changed by replacing removable coil elements. In this manner, an effective 55 cm RF coil can be used for large patients and a 50 cm RF coil for smaller patients. As another option, an additional set of end rings 72 may be provided. This enables removable coil segments of a shorter length to be connected such as head coils or coils for examining a more limited region of the subject.

With reference again to FIG. 1, in operation, a sequence control means 80 sends timing signals to a gradient coil control means 82 and a digital transmitter 84. The gradient coil control means 82 is connected with a series of current pulse generators 86 which, in turn, are connected with the primary and secondary gradient coil assemblies 22, 26. The transmitter 84 is connected with a quadrature transmit/receive divider 88 which is quadrature coupled with one of the end rings 38. The radio frequency transmitter generates radio frequency pulses for exciting and manipulating magnetic resonance of selected dipoles in the bore 12.

A radio frequency receiver 90, preferably a digital receiver, is connected with the end rings through the quadrature transmit/receive divider 88 for receiving and demodulating magnetic resonance signals emanating from the examined portion of the subject. An image reconstruction means 92, such as an inverse two-dimensional Fourier transform reconstruction means, reconstructs the received magnetic resonance signals into an electronic representation that is stored in an image memory 94. A video processor 96 converts electronic images stored in the memory 94 into appropriate format for display on a video monitor 98.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging apparatus comprising:

a toroidal superconducting magnet assembly for generating a temporally constant magnetic field through an examination region, the superconducting magnet assembly including a cylindrical member which defines a longitudinally extending bore around the examination region;

a gradient coil assembly including a cylindrical dielectric former which supports a plurality of gradient coils mounted in the bore;

a radio frequency coil assembly including:
   a pair of end ring assemblies extending circumferentially around and supported by the gradient coil assembly,
   a plurality of longitudinally extending coil elements, each of the longitudinally extending coil elements being individually enclosed in a dielectric housing, the dielectric housing being mechanically selectively (i) attachable to the gradient coil assembly with the coil elements radially inward from the gradient coil assembly and in electrical communication with the end ring assemblies at radio frequencies and (ii) detachable from the gradient coil assembly;

a sequence control for controlling the gradient coil assembly and the radio frequency coil assembly to generate gradient and radio frequency pulses of magnetic resonance imaging sequences.

2. The magnetic resonance imaging apparatus as set forth in claim 1 further including electrical circuit components which are electrically connected between the longitudinally extending coil elements and the end ring assemblies when the longitudinally extending coil element is attached to the gradient coil assembly.

3. The magnetic resonance imaging apparatus as set forth in claim 2 wherein the circuit components include a PIN diode which is switched between radio frequency signal conducting and blocking states by the application of a DC potential, the PIN diode being mounted in the corresponding housing.

4. The magnetic resonance imaging apparatus as set forth in claim 2 wherein the circuit components include first reactance circuits for tuning the radio frequency coil assembly to a first selected radio frequency.

5. The magnetic resonance imaging apparatus as set forth in claim 4 further including a second plurality of removable coil elements in associated dielectric housings, the second removable coil elements being connected with second reactance circuits for tuning the radio frequency to a second radio frequency, whereby the resonance frequency of the magnetic resonance imaging apparatus is selectively changeable by replacing the removable coil elements.

6. A magnetic resonance imaging apparatus comprising:

a toroidal superconducting magnet assembly for generating a temporally constant magnetic field through an examination region;

a cylindrical dielectric member mounted inside the toroidal superconducting magnet assembly, an inside surface of the dielectric member defining a patient receiving bore;

a gradient coil assembly including a plurality of gradient coils mounted between the toroidal superconducting magnet assembly and the dielectric member inner surface;

a radio frequency coil assembly including:
a pair of end ring assemblies extending circumferentially around the dielectric member inner surface between the superconducting magnet assembly and the dielectric member inner surface,
a plurality of longitudinally extending coil elements, the longitudinally extending coil elements being selectively mechanically (i) attachable to the dielectric member inner surface in electrical communication with the end ring assemblies at radio frequencies and (ii) selectively detachable from within the dielectric member, each of the removable radio frequency elements being encased in a dielectric housing having an innermost edge which abuts the inner surface of the dielectric member when mounted in the bore, an outer edge disposed towards the center of the bore, the outer edge being electrically insulated to protect a subject in the bore from electrical shock;

a sequence control for controlling the gradient coils and the radio frequency coil assembly to generate gradient and radio frequency pulses of magnetic resonance imaging sequences.

7. The magnetic resonance imaging apparatus as set forth in claim 6 wherein each longitudinally extending coil element includes:

an electrical conductor extending along an inside surface of the innermost edge of the housing such that physical displacement of the electrical conductor from the bore is maximized.

8. The magnetic resonance imaging apparatus as set forth in claim 6 further including:

an electrical connection means for electrically connecting the longitudinally extending conductor with the ring assemblies at radio frequencies.

9. The magnetic resonance imaging apparatus as set forth in claim 8 wherein the radio frequency electrical connecting means includes an electrical pin member which extends from the removable element and is received in a matching bore in the gradient coil assembly adjacent the ring assembly, when received in the bore, the pin element being in electrical communication at radio frequencies with the ring assembly.

10. The magnetic resonance imaging apparatus as set forth in claim 6 further including a mechanical interconnection means for selectively, mechanically interconnecting and releasing the dielectric housings from the gradient coil assembly bore.

11. A magnetic resonance apparatus comprising:

a toroidal magnetic assembly for generating a magnetic field through an examination region, the magnet assembly including a hollow former extending around the examination region;

a radio frequency birdcage coil assembly including:
a pair of end ring assemblies extending circumferentially around and supported by the former,
a first set of coil element assemblies including a first plurality of longitudinally extending coil element assemblies, the first longitudinally extending coil element assemblies being removably attachable and detachable from the former in electrical communication with the end ring assemblies at radio frequencies, when attached to the former, the first plurality of longitudinally extending coil assemblies define a birdcage style coil of a first diameter,
a second set of coil element assemblies including a second plurality of longitudinally extending coil element assemblies, the second longitudinally extending coil element assemblies being removably attachable and detachable from the former in electrical communication with the end ring assemblies at radio frequencies, when attached to the former, the second plurality of longitudinally extending coil assemblies define a birdcage style coil of a second diameter, the second diameter being different from the first diameter.

12. The magnetic resonance apparatus as set forth in claim 11 wherein each of the longitudinally extending coil element assemblies includes:

a dielectric housing;

a longitudinally extending electrically conductive element mounted within the housing;

an electrical connection means carried by the housing for selectively connecting the electrically conductive element with the end ring assemblies.

13. The magnetic resonance apparatus as set forth in claim 12 further including electrical components connected between the electrically conductive element and the electrical connecting means, the electrical components including at least one of: a PIN diode, a filter circuit, a tuning circuit, and a matching circuit.

14. The magnetic resonance apparatus as set forth in claim 11 further including:

a plurality of mechanical interlocks for mechanically (i)

locking the coil element assemblies to the hollow former with the coil element assemblies extending longitudinally along the hollow former in electrical connection with the end ring assemblies at radio frequencies and (ii) selectively releasing each coil element assembly from the hollow former.

15. The magnetic resonance apparatus as set forth in claim 14 wherein the magnet assembly further includes an array of gradient coils supported by the hollow former.

16. A method of magnetic resonance imaging with a magnetic resonance imaging apparatus which includes a toroidal magnetic assembly for generating a temporally constant magnetic field through an examination region and for selectively generating magnetic field gradients across the temporally constant magnetic field in the examination region, the magnet assembly including a cylindrical former extending around a patient receiving bore and a radio frequency coil assembly including a pair of end ring assemblies extending circumferentially around and supported by the cylindrical former and a plurality of longitudinally extending coil element assemblies, the longitudinally extending coil element assemblies being removably attachable and detachable from the cylindrical former in electrical communication with the end ring assemblies at radio frequencies, the method comprising:

selectively inserting a first plurality of the removable coil element assemblies which have a first effective diameter and which are tuned to a first resonance frequency;

inserting a patient into the bore and performing a magnetic resonance imaging sequence;

removing the patient from the bore and removing the first coil element assemblies;

inserting a second plurality of the removable coil element assemblies which have a second effective diameter and which are tuned to a second resonance frequency, at least one of (i) the first and second effective diameters and (ii) the first and second resonance frequencies being different from each other;

inserting another patient into the bore and performing another magnetic resonance imaging sequence.

17. The magnetic resonance imaging apparatus as set forth in claim 1 further including:

a mechanical locking means for selectively mechanically locking and releasing each of the removable coil elements with the gradient coil assembly.

* * * * *